United States Patent [19]

Heywang et al.

[11] 3,737,737

[45] June 5, 1973

[54] SEMICONDUCTOR DIODE FOR AN INJECTION LASER

[75] Inventors: Walter Heywang, Neukeferloh; Guenter Winstel, Ottobrunn; Karl-Heinz Zschauer, Munich, all of Germany

[73] Assignee: Siemens Aktiengesellschaft, Berlin and Munich, Germany

[22] Filed: Oct. 6, 1971

[21] Appl. No.: 187,029

[30] Foreign Application Priority Data

Oct. 9, 1970 Germany....................P 20 49 684.8

[52] U.S. Cl. ....317/234 R, 317/235 N, 317/235 AN, 317/235 AM, 317/235 AD, 331/94.5

[51] Int. Cl. ..............................................H05b 33/00

[58] Field of Search................317/235 AM, 235 AN, 317/235 N, 235 AD; 331/94.5

[56] References Cited

UNITED STATES PATENTS 3,626,257 12/1971 Esaki ..............................317/234 R

OTHER PUBLICATIONS

Esaki et al., I.B.M. Tech. Discl. Bull; Vol. 12, No. 12, May 1970, page 2134.

*Primary Examiner*—Martin H. Edlow
*Attorney*—Carlton Hill, Benjamin H. Sherman, Charles F. Meroni et al.

[57] ABSTRACT

A semiconductor diode for an injection laser characterized by a pn junction which has a lower threshold value for the diode current and/or which diode is capable of continuous operation at room temperature or above. The radiation producing range or zone of the pn junction has a variation in the concentration of doping with the variation being spatial and periodic. Variations have a maximum concentration of doping in a range of about $10^{16}$ through $10^{20}$ parts per cubic centimeter, a ratio of maximum concentration to minimum concentration of at least 2:1, and a distance between maximum concentrations, in the order of between 10 and 500 atomic distances in the lattice of the crystal. The variations in the concentration of the doping provides one or more interference bands in the forbidden band located between the conduction band and the valence band. An interference band is adjacent the edge of either the valence or the conduction band and the doping substance is selected in such a way that the transition probability for transit between the conduction band or valence band and the adjacent interference band is essentially larger than for inter-band recombination. To produce the semiconductor material for the diode, the doping material concentration is varied during the growth of the crystal. For example, if the crystal is grown from a gas phase by an epitaxial deposition, the concentration of doping material in the gas phase is varied with respect to the desired periodicity and with respect to the speed and time for the growth of the crystal. If the crystal is formed by epitaxial deposition of the material from the liquid phase, the variation in doping is caused by variations in the cooling speed with respect to the speed of the growth of the crystal. The periodic doping can be varied also by selection of the rate of cooling by selection of speed of rotation and by excentricity of the crystal pulled from a melt or by growing the crystal with a spiraling growth.

5 Claims, 4 Drawing Figures

INVENTORS
Walter Heywang
Guenther Winstel
Karl-Heinz Zschauer
BY Hill, Sherman, Meroni, Gross & Simpson ATTYS.

SEMICONDUCTOR DIODE FOR AN INJECTION LASER

BACKGROUND OF THE INVENTION

1. Field Of The Invention

The present invention is directed to a semiconductor diode for use in an injection laser with a pn junction which has a lower threshold value for the diode current and/or which diode is suitable for continuous operation at room temperatures or above.

2. Prior Art

Semiconductor injection lasers using a semiconductor diode such as galluim arsenide are known in the art. A laser radiation occurs at the pn junction due to the photon emitted by the recombination of electrons with holes. However, presently known laser diodes only operate continuously at very low temperatures. The threshold value of the diode current is highly sensitive to an increase in the operating temperature and the value will increase with a temperature increase. Thus when operated as a pulse laser at room temperature, the time or period between pulses must be sufficient to enable the heat generated during the pulse to dissipate to prevent too much raising the temperature of the diode.

One suggestion for lowering the threshold value of the diode current is to provide a semiconductor diode having mechanically produced internal stresses. Another suggestion is to provide a very high doping so that in the range of the band edge the differential density of states $dN/dE$ of the terms has an exponential dependency on energy as known herefore. However it has not been possible to have a continuous operation of the laser diode prepared according to these suggestions at room temperature.

It has also been suggested to lower the threshold value of the diode current by applying a heterojunction. However, the production of the thin layers for this junction has encountered technological difficulties which must still be overcome.

SUMMARY OF THE INVENTION

The present invention is directed to a semiconductor laser diode for an injection laser and a method of forming the semiconductor material, which diode has a lower threshold value for the diode current and/or is capable of continuous operation at room temperature or temperatures higher than room temperatures. The semiconductor diode has a radiation producing zone in or near the pn junction having a variation in the concentration of the doping with the variations having a spatial periodicity with a maximum concentration of doping in a range of about $10^{16}$ through $10^{20}$ parts per cubic centimeter, with a ratio of maximum to minimum concentration of the doping being at least 2:1; and the maximum concentrations of doping being arranged in distances in the order of 10 to 500 atomic distances in the lattice of the crystal. A diode having such variations in the concentrations of doping has at least one and preferably two interference bands which are located in the forbidden band between the conduction band and the valence band with an interference band being adjacent an edge of either the conduction or valence band so that the transition probabilities for transition from the conduction or valence band to an adjacent interference band is essentially larger than the inter-band recombination. To provide the semiconductor material for the diode with the variation in the concentration of the doping, the invention also is directed to a method of changing the concentration of the doping during formation of the semiconductor material. Such a method can be accomplished by varying the concentration of the doping material in the gas phase by which the semiconductor material is formed by epitaxial deposition or by varying the rate of cooling when the semiconductor material is formed by an epitaxial deposition from a liquid phase. Another method of producing the material is by rotating a crystal as it is pulled from the melt which rotation is either a centric or eccentric rotation. The speed of rotation being controlled to provide said periodicity of doping. Temperature variations which occur during rotation of the crystal result in a corresponding periodic doping of the crystal because the doping rate depends on those temperature variations. Another method is to utilize spiral growth for the production of the semiconductor crystal which growth causes a periodic doping.

Accordingly it is an object of the present invention to provide a semiconductor diode for an injection laser and a method of forming the semiconductor material which diode has a low threshold value for the diode current required during operation of the laser.

Another object of the present invention is to provide a semiconductor material which diode is used in injection lasers that can operate continuously at room temperatures or temperatures thereabove.

Other objects, features and advantages of the invention will be readily apparent from the foregoing description of the preferred embodiments taken in conjunction with the accompanying drawings although various modifications may be effected without departing from the spirit and scope of the novel concept of the disclosure.

DESCRIPTION OF THE PREFERRED EMBODIMENT

Figure 3:
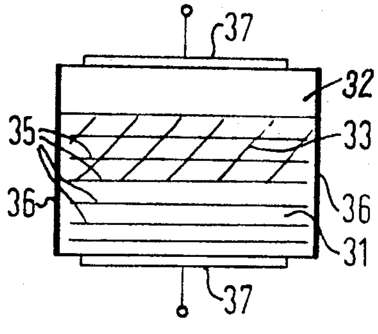
FIG. 3 is a schematic illustration of a cross section taken on a plane transverse to the pn junction of an embodiment of the diode of the present invention.
Figure 4:
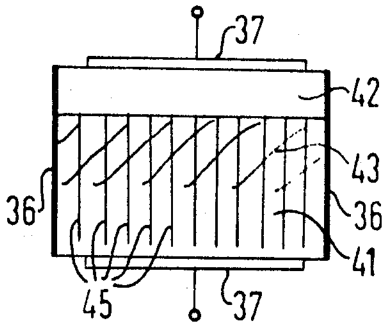
FIG. 4 is a schematic illustration of a cross section taken on a plane transverse to the pn junction of another embodiment of a diode of the present invention.

The principles of the present invention are particularly used for a semiconductor diode such as illustrated in FIGS. 3 and 4 utilized in an injection laser.

The principles of the present invention can be explained using a quantum mechanical theory of the motion of electrons in solids. In all solids, there are bands of allowed energy levels for electrons and forbidden bands. In semiconductors, a valence band in which electrons are normally retained and the conduction band in which the electrons move during transit are normally separated by a forbidden band or gap.

Figure 1:
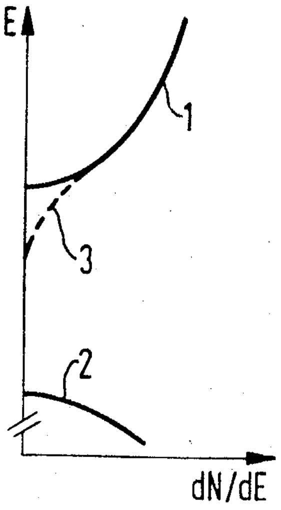
FIG. 1 is a graph of the density of states of semiconductor material doped according to prior art used for an injection laser.

A graphical illustration of the energy E against the density of states ($dN/dE$) is shown in FIG. 1 for a semiconductor material doped according to prior art used in an injection laser. In the graph of FIG. 1, a curve for the conduction band is identified at 1 and a corresponding curve for the valence band is identified as 2. The high concentration of doping in the prior art doped material produces an exponential tail 3, which is illustrated in a dashed line, for the curve 1. The energy levels between the curve 2 and the curve 1 and its exponential tail 3 is the forbidden band or gap.

In the present invention, instead of obtaining the tail 3 which occurs by a succession of smearing of the energy states with high doping and a statistical distribution, an interference band 23 or 25 is produced by a variation of the concentration of the doping material in the semiconductor material. The doping has a spatial and periodic distribution of the doping material in the semiconductor material. The variation of the concentration of the doping material in the radiation producing range or active region of the pn junction has a maximum concentration in the range of $10^{16}$ to $10^{20}$ parts per cubic centimeter and preferably in a range of $10^{18}$ to $10^{20}$ parts per cubic centimeter. The ratio between the maximum concentration and the minimum concentration is at least 2:1 and preferably is more than 10:1. The variation in the doping concentration is distributed preferably with a spacing between maximum concentrations of about 10 to 500 atomic distances between the atoms in the lattice of the crystal. A doping distribution with said variations in the concentration causes an interference band or band of energy levels such as 23 or 25 to be formed in the forbidden band adjacent the edge of either the conduction band 1 or the valence band 2 or as illustrated a pair of bands are present with band 23 adjacent band 1 and band 25 adjacent band 2.

Each of the interference bands has a lower density of states ($dN/dE$) than is present in the corresponding conduction or valence band. With the lower density a population inversion can be reached even with a lower injection current density. It is an advantage that the interference band lies essentially in the forbidden band. A positioning of the interference band close to one of the band edges is particularly favorable since then the transition of probability between the band, whether it is the valence band or the conduction band, and the interference band has a high value.

It should be pointed out that in consequence of the ratio of maximum to minimum concentration of at least 2:1 the selection of the eigenvalues of the electron or hole wave length, corresponding to the periodicity, readily adjust itself.

It should be pointed out that the concentration of doping outside of the maximum concentration may be lower if desired. It should also be stated that the absolute maximum concentration of doping may fluctuate as long as the fluctuation in the maximum concentrations do not interfere with the periodicity.

Figure 2:
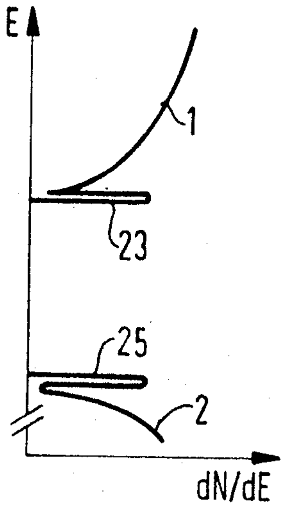
FIG. 2 is a graph similar to FIG. 1 of the density of states of semiconductor material doped according to the present invention.

The energy position of the interference band in the graph of FIG. 2 is a first approximation, excluding extreme cases, and corresponds to an energy position which an insulated atom of the doping material would have in the lattice. The transition probabilities from the conduction band or the valence band respectively to the interference band may be taken from prior art for a particularly doping substance for a given semiconductor material with an exactness which suffices for practicing this invention. The transition probabilities for the energetically-smaller distances between the interference band and the adjacent band are still large with respect to the transition probabilities for the interband recombination between the conduction band and the valence band of the respective semiconductor materials as known from the prior art.

The interference bands, such as 23 and 25 that are close to their respective bands illustrated by the curves 1 and 2 and have a high value for the transition probability, can be obtained when a doping substance whether a donor or acceptor type doping and which is common for a particular semiconductor base material is applied with the variations in concentration distributed spatial as discussed hereinabove.

In order to obtain a lower threshold value for the diode current during the laser operation, it is particularly important that two energetically separate interference bands or bands of energy levels are present in the forbidden band. The transition between the pair of interference bands then provide a laser operation similar to the operation of a prior art four level laser. When one interference band lies close to the valence band and the other lies close to the conduction band, the transition probabilities between each of the interference bands and its respective band is particularly high. This high probability guarantees a fast filling of the upper interference band and a fast emptying of the lower interference band which is particularly favorable for the laser operation.

An example of the laser diodes produced in accordance to the invention is schematically illustrated in FIG. 3. The diode has an area 31 periodically doped for instances with a P-doping and an area 32 which is n-doped which can be produced for instances by means of diffusing of n-doping substance into an originally p-conductive material. An area 33 indicated by cross hatching is the laser active zone or region which is produced by means of carrier injection in the range in this example. As known, the exact position of the laser active zone or region depends entirely on the individual diode. The lines 35 are provided to indicate levels of maximum doping. The diode has lateral surfaces 36, 36 which provide a resonator for the laser radiation produced in a laser active region 33 which is similar to known semiconductor diodes used in injection lasers. To apply the excitation to the diode, means such as electrodes 37 are provided on side faces of the diode.

A preferred embodiment of the laser diode produced in accordance with this invention is illustrated in FIG. 4 and has planes of maximum doping which are directed vertically to the direction of the propagation of the radiation produced in the laser active zone. The diode has a region 41 of p-doped material and a region 42 of n-conductive material which as in the previously described embodiment was produced by diffusing n-doping into a p-doped area to render the p-doping ineffective. A laser active zone or region 43 is indicated by the cross hatching line and the parallel surfaces 36 which may be formed by cleavage planes of the crystal providing a resonator for the radiation produced in the zone 43. As mentioned above, the lines 45 indicate the planes of maximum doping which extend vertically to the direction of the radiation produced by the laser.

To produce the semiconductor material for the diodes used in an injection laser, the present invention follows a method of producing the semiconductor material and applying a doping to it with the improvement in the method comprising varying the concentration of the doping material during the formation of the material. One example of a method of producing the material to provide a one dimensional periodicity in one direction is obtained by means of an epitaxial deposition of the material from a gas phase containing the doping material in which the concentration of the doping material in the gas phase is varied in accordance to the periodicity and the speed of deposition.

Another embodiment of the method for providing the semiconductor material is an epitaxial deposition of the material from a liquid phase and utilizes a variation of the cooling speed of the melt or fused material to change the concentration of the doping. By changing the cooling speed, the semiconductor material being deposited onto the substrate will change in concentration of doping. It should be pointed out that with a constant cooling speed minor changes in the temperature at the interface between the crystal and the melt will create a variation in the speed of crystallization since a release of heat of fusion during forming of the crystal from a molten material will cause at the interface a temperature variation which is very small, but large enough to create a self exciting periodicity in the speed of crystallization.

Another embodiment of the method of producing the semiconductor material is to pull a rotating crystal from the melt. The speed of rotation will cause temperature variations at the growth surface which temperature variations like in the previously mentioned embodiment cause a corresponding periodic doping of the pulled crystal since the rate of incorporation of the doping material in the crystal will depend on these variations. By controlling the speed of rotation of the crystal whether it is centrically rotated or eccentrically rotated will control the temperature variation to produce the correct periodicity as demanded.

A large number of semiconductor materials have a growth in which the growth surfaces are spiral-surface-like and are called a spiral growth crystals. Spiral growth which is common particularly with silicon carbide is obtained when a corresponding grown seed crystal is utilized. During the spiral growth, the spiraling that occurs will produce a periodicity in the doping and thus by controlling the rate of the spiriling during the growth of the crystal, the periodicity in the doping will occur.

Although minor modifications might be suggested by those versed in the art, it should be understood that we wish to employ within the scope of the patent warranted hereon all such modifications that reasonable and properly come within the scope of our contribution to the art.

We claim:

1. A semiconductor laser diode for an injection laser, said diode having a pn junction formed by a p doped and n doped layers and having a lower threshold value for the diode current and being capable of continuous operation at room temperature and above, the improvement comprising one of the layers in the radiation producing range of the pn junction having a variation in the concentration of the doping with the variation having a spatial periodicity with a maximum concentration of the doping having a range of about $10^{16}$ to $10^{20}$ parts per cubic centimeter, with a ratio of the maximum concentration to minimum concentration of the doping of at least 2:1 and the maxima of concentration of the doping having a distance of an order of between 10 to 500 atomic distances in the lattice of the crystal, said variations in the concentration of the doping providing at least one interference band in the forbidden band adjacent an edge of one of the conduction and valence bands and the doping substance being selected in such a way so that the transition probability for transition from the conduction or valence bands respectively to the interference band or bands is essentially larger than for inter-band recombination.

2. A semiconductor laser diode according to claim 1, wherein the maximum concentration of the doping lies in spaced planes which are directed vertically to the pn junction.

3. A semiconductor laser diode according to claim 1, characterized in that the maximum concentration of doping is in a range of $10^{18}$ to $10^{20}$ parts per cubic centimeter.

4. A semiconductor laser diode according to claim, 1 wherein the ratio of maximum concentration to minimum concentration is more than 10:1.

5. A semiconductor laser diode according to claim 1, having a pair of interference bands with one band being close to the edge of the conduction band and the other interference band being close to the edge of the valence band.

* * * * *